(12) United States Patent
Takahashi (10) Patent No.: US 11,881,879 B2
(45) Date of Patent: Jan. 23, 2024

(54) RADIO-FREQUENCY MODULE AND COMMUNICATION DEVICE

(71) Applicant: Murata Manufacturing Co., Ltd., Kyoto (JP)

(72) Inventor: Hidetaka Takahashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 10 days.

(21) Appl. No.: 17/645,087

(22) Filed: Dec. 20, 2021

(65) Prior Publication Data

US 2022/0116061 A1 Apr. 14, 2022

Related U.S. Application Data

(63) Continuation of application No. PCT/JP2020/025015, filed on Jun. 25, 2020.

(30) Foreign Application Priority Data

Jul. 3, 2019 (JP) .................................. 2019-124840

(51) Int. Cl.
*H04B 1/38* (2015.01)
*H04B 1/04* (2006.01)
(Continued)

(52) U.S. Cl.
CPC ......... *H04B 1/0458* (2013.01); *H04B 1/0078* (2013.01); *H04B 1/03* (2013.01); *H04L 5/14* (2013.01)

(58) Field of Classification Search
CPC .... H04B 1/0458; H04B 1/006; H04B 1/0078; H04B 1/0483; H04B 1/16; H04B 1/38; H04B 1/40; H04B 1/03; H04L 5/14
See application file for complete search history.

(56) References Cited

U.S. PATENT DOCUMENTS 6,472,952 B1 10/2002 Sakai et al.
9,270,322 B2 * 2/2016 Pivit ....................... H01P 3/121
(Continued)

FOREIGN PATENT DOCUMENTS

CN 101006651 A 7/2007
CN 104639091 A 5/2015
(Continued)

OTHER PUBLICATIONS

International Search Report issued in Application No. PCT/JP2020/025015, dated Sep. 29, 2020.
(Continued)

*Primary Examiner* — Tuan Pham
(74) *Attorney, Agent, or Firm* — Pearne & Gordon LLP (57) ABSTRACT

A radio-frequency module includes a mounting substrate, a power amplifier, a low-noise amplifier, at least one first transmission filter, and at least one first reception filter. The mounting substrate has a first main surface and a second main surface. The power amplifier is disposed on a side where the first main surface of the mounting substrate is located. The low-noise amplifier is disposed on a side where the second main surface of the mounting substrate is located. The first transmission filter allows a TDD transmission signal to pass therethrough. The first reception filter allows a TDD reception signal to pass therethrough. The first transmission filter is disposed on the side where the first main surface of the mounting substrate is located. The first reception filter is disposed on the side where the second main surface of the mounting substrate is located.

5 Claims, 4 Drawing Sheets

(51) Int. Cl.
*H04B 1/00* (2006.01)
*H04B 1/03* (2006.01)
*H04L 5/14* (2006.01)

(56) References Cited

U.S. PATENT DOCUMENTS

| | | | |
|---|---|---|---|
| 9,860,025 B2* | 1/2018 | Yang | H04L 1/1825 |
| 10,674,607 B2* | 6/2020 | Park | G06F 1/1658 |
| 11,245,381 B2* | 2/2022 | Schmalzl | H03H 9/02031 |
| 2009/0011726 A1 | 1/2009 | Nishimura et al. | |
| 2011/0279193 A1 | 11/2011 | Furutani | |
| 2014/0329475 A1 | 11/2014 | Ellä et al. | |
| 2015/0123744 A1 | 5/2015 | Nishimura et al. | |
| 2016/0134414 A1 | 5/2016 | Pehlke | |
| 2016/0380652 A1 | 12/2016 | Anthony et al. | |
| 2017/0264336 A1 | 9/2017 | Saji | |
| 2017/0301654 A1* | 10/2017 | Frenette | H01L 25/0657 |
| 2018/0152945 A1* | 5/2018 | Balteanu | H04L 5/001 |
| 2020/0007096 A1 | 1/2020 | Kita | |

FOREIGN PATENT DOCUMENTS

| | | |
|---|---|---|
| CN | 107196620 A | 9/2017 |
| JP | 2006-203652 A | 8/2006 |
| JP | 2014-526847 A | 10/2014 |
| JP | 2017-017691 A | 1/2017 |
| WO | 00/28673 A1 | 5/2000 |
| WO | 2010/087307 A1 | 8/2010 |
| WO | 2018/168500 A1 | 9/2018 |

OTHER PUBLICATIONS

Written Opinion issued in Application No. PCT/JP2020/025015, dated Sep. 29, 2020.

* cited by examiner

RADIO-FREQUENCY MODULE AND COMMUNICATION DEVICE

CROSS REFERENCE TO RELATED APPLICATION

This is a continuation of International Application No. PCT/JP2020/025015 filed on Jun. 25, 2020 which claims priority from Japanese Patent Application No. 2019-124840 filed on Jul. 3, 2019. The contents of these applications are incorporated herein by reference in their entireties.

BACKGROUND OF THE DISCLOSURE

Field of the Disclosure

The present disclosure generally relates to a radio-frequency module and a communication device, and more specifically relates to a radio-frequency module that includes a time division duplex (TDD) first transmission filter and a TDD first reception filter, and to a communication device including the radio-frequency module.

Description of the Related Art

In the related art, radio-frequency modules that perform transmission and reception of two different communication bands are known (for example, refer to Patent Document 1).

A radio-frequency module disclosed in Patent Document 1 includes a frequency division duplex (FDD) duplexer and a time division duplex (TDD) filter. The FDD duplexer includes an FDD transmission filter that allows an FDD transmission signal to pass therethrough and an FDD reception filter that allows an FDD reception signal to pass therethrough. The TDD filter allows a TDD transmission signal and a TDD reception signal to pass therethrough.

Patent Document 1: Japanese Unexamined Patent Application Publication No. 2017-17691

BRIEF SUMMARY OF THE DISCLOSURE

In the radio-frequency module of the related art disclosed in Patent Document 1, the reception sensitivity to a TDD reception signal may be reduced. In other words, the isolation between the transmission of a TDD transmission signal and the reception of a TDD reception signal may be degraded.

The present disclosure was made in consideration of this point, and it is an object of the present disclosure to provide a radio-frequency module and a communication device that can improve the isolation between the transmission of a TDD transmission signal and the reception of TDD reception signal.

A radio-frequency module according to an aspect of the present disclosure includes a mounting substrate, a power amplifier, a low-noise amplifier, at least one first transmission filter, and at least one first reception filter. The mounting substrate has a first main surface and a second main surface. The first main surface and the second main surface face each other. The power amplifier is disposed on a side where the first main surface of the mounting substrate is located. The low-noise amplifier is disposed on a side where the second main surface of the mounting substrate is located. The first transmission filter allows a TDD transmission signal to pass therethrough. The first reception filter allows a TDD reception signal to pass therethrough. The first transmission filter is disposed on the side where the first main surface of the mounting substrate is located. The first reception filter is disposed on the side where the second main surface of the mounting substrate is located.

A communication device according to an aspect of the present disclosure includes the above-described radio-frequency module and a signal processing circuit. The signal processing circuit processes the TDD transmission signal and the TDD reception signal.

With the radio-frequency module and the communication device according to the aspects of the present disclosure, the isolation between the transmission of a TDD transmission signal and the reception of a TDD reception signal can be improved.

DETAILED DESCRIPTION OF THE DISCLOSURE

Hereafter, a radio-frequency module and a communication device according to an embodiment will be described while referring to the drawings. FIGS. 1, 2, 3A, 3B, 5A, and 5B referred to in the following embodiment and so forth are schematic drawings and the ratios between the sizes, thicknesses, and so forth of the individual constituent elements in the drawings do not necessarily reflect the actual dimensional ratios.

Embodiment (1) Radio-Frequency Module

The configuration of a radio-frequency module according to an embodiment will be described while referring to the drawings.

Figure 4:
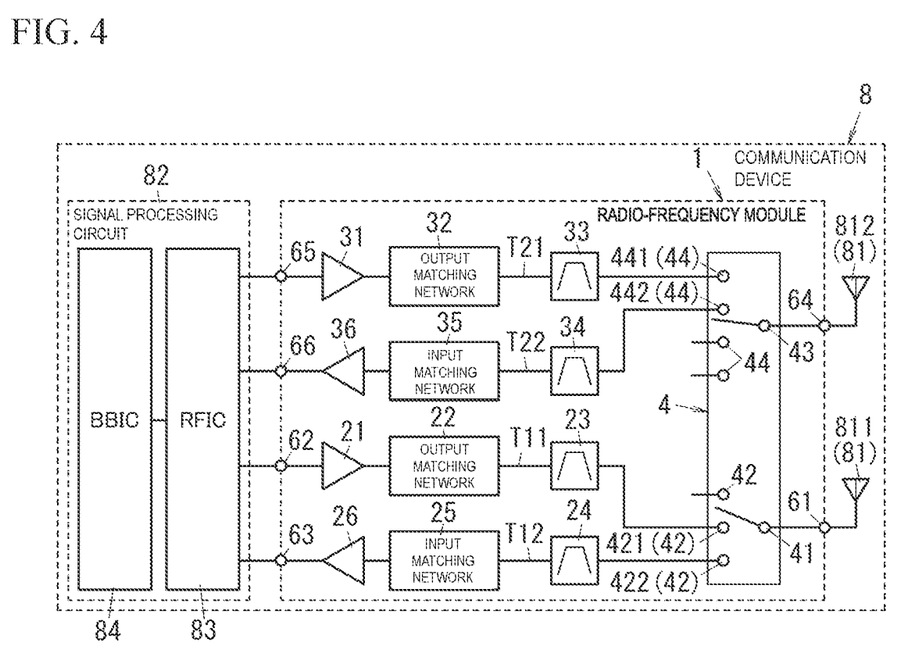
FIG. 4 is a circuit configuration diagram of a communication device according to the embodiment.

As illustrated in FIG. 4, a radio-frequency module 1 according to an embodiment includes a first power amplifier 21, a first output matching network 22, a first transmission filter 23, a first reception filter 24, a first input matching network 25, and a first low-noise amplifier 26. The radio-frequency module 1 further includes a second power amplifier 31, a second output matching network 32, a second transmission filter 33, a second reception filter 34, a second input matching network 35, a second low-noise amplifier 36, and an antenna switch 4.

In addition, as illustrated in FIGS. 1, 2, 3A, and 3B, the radio-frequency module 1 further includes a mounting substrate 5, a plurality of external connection terminals 6, a first resin member 71, and a second resin member 72.

As illustrated in FIG. 4, the radio-frequency module 1 is, for example, used in a communication device 8. In the example in FIG. 4, the communication device 8 is, for example, a mobile phone such as a smart phone. The communication device 8 is not limited to being a mobile phone and may instead be a wearable terminal such as a smart watch, for example.

The radio-frequency module 1 performs the communication in a first communication band and performs the communication in a second communication band. In more detail, the radio-frequency module 1 performs the transmission of a transmission signal of the first communication band (hereafter, "first transmission signal") and the reception of a reception signal of the first communication band (hereafter, "first reception signal"). In addition, the radio-frequency module 1 performs the transmission of a transmission signal of the second communication band (hereafter, "second transmission signal") and the reception of a reception signal of the second communication band (hereafter, "second reception signal").

The first transmission signal and the first reception signal are time division duplex (TDD) signals. On the other hand, the second transmission signal and the second reception signal are frequency division duplex (FDD) signals. The second transmission signal and the second reception signal are not limited to being FDD signals and may instead be TDD signals. TDD is a wireless communication technology in which the same frequency band is allocated to transmission and reception in wireless communication and transmission and reception are switched between at different times. FDD is a wireless communication technology in which transmission and reception are performed by allocating different frequency bands to transmission and reception in wireless communication.

The radio-frequency module 1 simultaneously performs the communication in the first communication band and communication in the second communication band. Carrier aggregation (CA) is an example of the simultaneous communication.

An example of a combination of the first communication band and the second communication band is a combination in which the first communication band is Band 11 and the second communication band is Band 42. In Band 11 used in FDD, the frequency band of the transmission signal is 1920 MHz to 1980 MHz and the frequency band of the reception signal is 2110 MHz to 2170 MHz. In Band 42 used in TDD, the frequency band of the transmission signal and the reception signal is 3400 MHz to 3600 MHz.

(2) Circuit Configuration of Radio-Frequency Module

Hereafter, the circuit configuration of the radio-frequency module 1 according to the embodiment will be described while referring to FIG. 4. Here, a case where the first transmission signal and the first reception signal are FDD signals and the second transmission signal and the second reception signal are TDD signals will be described.

(2.1) Transmission in First Communication Band

The first power amplifier 21 is an amplifier that amplifies the first transmission signal. The first power amplifier 21 is provided between a first input terminal 62 and the first output matching network 22 along a first transmission path T11 connected between a first common terminal 61 and the first input terminal 62. The first power amplifier 21 has an input terminal and an output terminal, and the input terminal of the first power amplifier 21 is connected to an external circuit (for example, a signal processing circuit 82) via the first input terminal 62. The first input terminal 62 is a terminal to which a radio-frequency signal (first transmission signal) from an external circuit is inputted to the radio-frequency module 1. The output terminal of the first power amplifier 21 is connected to the first output matching network 22. The first power amplifier 21 is controlled by a power amplifier controller 11, for example.

The first output matching network 22 is provided between the first power amplifier 21 and the first transmission filter 23 along the first transmission path T11. The first output matching network 22 is a circuit for realizing the impedance matching between the first power amplifier 21 and first transmission filter 23.

The first transmission filter 23 is a transmission filter for the first communication band that allows the first transmission signal (TDD transmission signal) to pass therethrough. In more detail, the first transmission filter 23 is provided between the first output matching network 22 and the antenna switch 4 along the first transmission path T11. The first transmission filter 23 allows a transmission signal of the transmission band of the first communication band, i.e., the first transmission signal, out of a radio-frequency signal amplified by the first power amplifier 21 to pass therethrough.

The first power amplifier 21, the first output matching network 22, and the first transmission filter 23 correspond to transmission circuit elements provided along the first transmission path T11 for the first transmission signal.

(2.2) Reception in First Communication Band

The first reception filter 24 is a reception filter for the first communication band that allows the first reception signal (TDD reception signal) to pass therethrough. In more detail, the first reception filter 24 is provided between the antenna switch 4 and the first input matching network 25 along a first reception path T12 connected between the first common terminal 61 and a first output terminal 63. The first reception filter 24 allows a reception signal of the reception band of the first communication band, i.e., the second reception signal out of a radio-frequency signal input from the first common terminal 61 to pass therethrough.

The first input matching network 25 is provided between the first reception filter 24 and the first low-noise amplifier 26 along the first reception path T12. The first input matching network 25 realizes the impedance matching between the first reception filter 24 and the first low-noise amplifier 26.

The first low-noise amplifier 26 is an amplifier that amplifies the first reception signal with low noise. The first low-noise amplifier 26 is provided between the first input matching network 25 and the first output terminal 63 along the first reception path T12. The first low-noise amplifier 26 has an input terminal and an output terminal, and the input terminal of the first low-noise amplifier 26 is connected to the first input matching network 25. The output terminal of the first low-noise amplifier 26 is connected to an external circuit (for example, the signal processing circuit 82) via the first output terminal 63. The first output terminal 63 is a terminal from which a radio-frequency signal (first reception signal) from the first low-noise amplifier 26 is outputted to an external circuit.

(2.3) Transmission in Second Communication Band

The second power amplifier 31 is an amplifier that amplifies the second transmission signal. The second power amplifier 31 is provided between a second input terminal 65 and the second output matching network 32 along a second transmission path T21 connected between a second common terminal 64 and the second input terminal 65. The second power amplifier 31 has an input terminal and an output terminal, and the input terminal of the second power amplifier 31 is connected to an external circuit (for example, the signal processing circuit 82) via the second input terminal 65. The second input terminal 65 is a terminal to which a radio-frequency signal (first transmission signal) from an external circuit is inputted to the radio-frequency module 1. The output terminal of the second power amplifier 31 is connected to the second output matching network 32. The second power amplifier 31 is controlled by the power amplifier controller 11, for example.

The second output matching network 32 is provided between the second power amplifier 31 and the second transmission filter 33 along the second transmission path T21. The second output matching network 32 is a circuit for realizing the impedance matching between the second power amplifier 31 and second transmission filter 33.

The second transmission filter 33 is a transmission filter for the second communication band that allows the second transmission signal (FDD transmission signal) to pass therethrough. In more detail, the second transmission filter 33 is provided between the second output matching network 32 and the antenna switch 4 along the second transmission path T21. The second transmission filter 33 allows a transmission signal of the transmission band of the second communication band, i.e., the second transmission signal, out of a radio-frequency signal amplified by the second power amplifier 31 to pass therethrough.

(2.4) Reception in Second Communication Band

The second reception filter 34 is a reception filter for the second communication band that allows the second reception signal (FDD reception signal) to pass therethrough. In more detail, the second reception filter 34 is provided between the antenna switch 4 and the second input matching network 35 along a second reception path T22 connected between the second common terminal 64 and a second output terminal 66. The second reception filter 34 allows a reception signal of the reception band of the second communication band, i.e., the second reception signal out of a radio-frequency signal input from the second common terminal 64 to pass therethrough.

The second input matching network 35 is provided between the second reception filter 34 and the second low-noise amplifier 36 along the second reception path T22. The second input matching network 35 realizes the impedance matching between the second reception filter 34 and the second low-noise amplifier 36.

The second low-noise amplifier 36 is an amplifier that amplifies the second reception signal with low noise. The second low-noise amplifier 36 is provided between the second input matching network 35 and the second output terminal 66 along the second reception path T22. The second low-noise amplifier 36 has an input terminal and an output terminal, and the input terminal of the second low-noise amplifier 36 is connected to the second input matching network 35. The output terminal of the second low-noise amplifier 36 is connected to an external circuit (for example, the signal processing circuit 82) via the second output terminal 66. The second output terminal 66 is a terminal from which a radio-frequency signal (second reception signal) from the second low-noise amplifier 36 is outputted to an external circuit.

The second reception filter 34, the second input matching network 35, and the second low-noise amplifier 36 are reception circuit elements that are provided along a signal path for the reception signal of the second communication band, which is higher than the first communication band.

(2.5) Antenna Switch

The antenna switch 4 has a first common terminal 41, a plurality of first selection terminals 42, a second common terminal 43, and a plurality of second selection terminals 44. The first common terminal 41 is connected to the first common terminal 61. Among the plurality of first selection terminals 42, a first selection terminal 421 is connected to the first transmission filter 23, and a first selection terminal 422 is connected to the first reception filter 24. A first antenna 811 is connected to the first common terminal 61. The second common terminal 43 is connected to the second common terminal 64. Among the plurality of second selection terminals 44, a second selection terminal 441 is connected to the second transmission filter 33, and a second selection terminal 442 is connected to the second reception filter 34. A second antenna 812 is connected to the second common terminal 64.

The antenna switch 4 switches the connection state between the first common terminal 41 and the plurality of first selection terminals 42. In addition, the antenna switch 4 switches the connection state between the second common terminal 43 and the plurality of second selection terminals 44. In the radio-frequency module 1, the second selection terminal 441 and the second selection terminal 442 of the antenna switch 4 are exclusively connected to the second common terminal 43 during TDD communication. In more detail, the antenna switch 4 is, for example, controlled by the signal processing circuit 82. The antenna switch 4 electrically connects the first common terminal 41 and any one of the plurality of first selection terminals 42 to each other in accordance with a control signal from an RF signal processing circuit 83 of the signal processing circuit 82. In addition, the antenna switch 4 electrically connects the second common terminal 43 and any one of the plurality of second selection terminals 44 to each other in accordance with a control signal from the RF signal processing circuit 83 of the signal processing circuit 82.

(3) Structure of Radio-Frequency Module

Hereafter, the structure of the radio-frequency module 1 according to the embodiment will be described while referring to the drawings.

As illustrated in FIGS. 1, 2, 3A, and 3B, the radio-frequency module 1 includes the mounting substrate 5, the plurality of external connection terminals 6, the first resin member 71, and the second resin member 72.

The radio-frequency module 1 can be electrically connected to an external substrate (not illustrated). The external substrate, for example, corresponds to a mother substrate of a mobile phone, a communication device, or the like. Note that the meaning of "the radio-frequency module 1 can be electrically connected to an external substrate" includes not only a case where the radio-frequency module 1 is directly mounted on an external substrate but also a case where the radio-frequency module 1 is indirectly mounted on an external substrate. A case where the radio-frequency module 1 is indirectly mounted on an external substrate is, for example, a case where the radio-frequency module 1 is mounted on another radio-frequency module mounted on an external substrate.

(3.1) Mounting Substrate

As illustrated in FIGS. 1, 2, 3A, and 3B, the mounting substrate 5 has a first main surface 51 and a second main surface 52. The first main surface 51 and the second main surface 52 face each other in a thickness direction D1 of the mounting substrate 5. The second main surface 52 faces an external substrate when the radio-frequency module 1 is installed on an external substrate (not illustrated). The mounting substrate 5 is a double-sided mounting substrate that has circuit components mounted on both the first main surface 51 and the second main surface 52.

The mounting substrate 5 is a multilayer substrate in which a plurality of dielectric layers are stacked. Although not illustrated, the mounting substrate 5 has a plurality of conductor pattern parts and a plurality of through electrodes. The plurality of conductor pattern parts includes a conductor pattern part that is set to the ground potential. The plurality of through electrodes are used to electrically connect elements mounted on the first main surface 51 and the conductor pattern parts in the mounting substrate 5 to each other. In addition, the plurality of through electrodes are used to electrically connect elements mounted on the first main surface 51 and elements mounted on the second main surface 52 to each other and to electrically connect the conductor pattern parts in the mounting substrate 5 and the external connection terminals 6 to each other.

The first power amplifier 21, the first transmission filter 23, the second transmission filter 33, and the antenna switch 4 are disposed on the first main surface 51 of the mounting substrate 5. The first reception filter 24, the second reception filter 34, the first low-noise amplifier 26, and the power amplifier controller 11 are disposed on a side where the second main surface 52 of the mounting substrate 5 is located. In addition, the plurality of external connection terminals 6 are disposed on a side where the second main surface 52 of the mounting substrate 5 is located.

(3.2) Circuit Elements for First Communication Band

As illustrated in FIGS. 1, 2, 3A, and 3B, the first power amplifier 21 is disposed on a side where the first main surface 51 of the mounting substrate 5 is located. In the example in FIGS. 1, 2, 3A, and 3B, the first power amplifier 21 is mounted on the first main surface 51 of the mounting substrate 5. However, part of the first power amplifier 21 may be mounted on the first main surface 51 of the mounting substrate 5, and the remainder of the first power amplifier 21 may be built into the mounting substrate 5. In short, the first power amplifier 21 is disposed nearer to the first main surface 51 than to the second main surface 52 of the mounting substrate 5 and is at least partially mounted on the first main surface 51.

Figure 1:
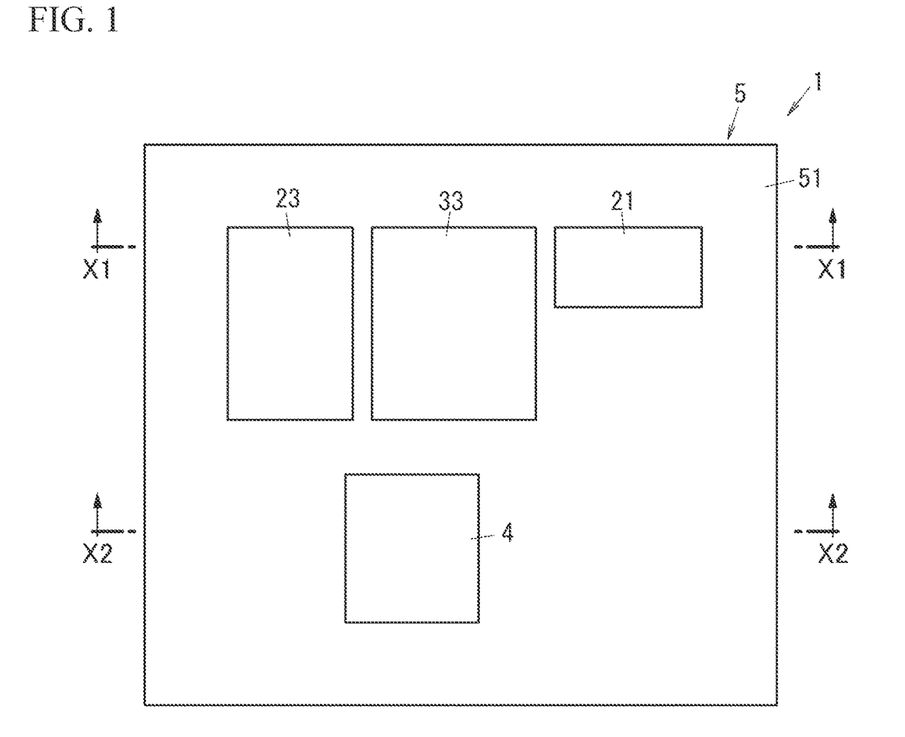
FIG. 1 is a plan view of a radio-frequency module according to an embodiment.
Figure 3A:
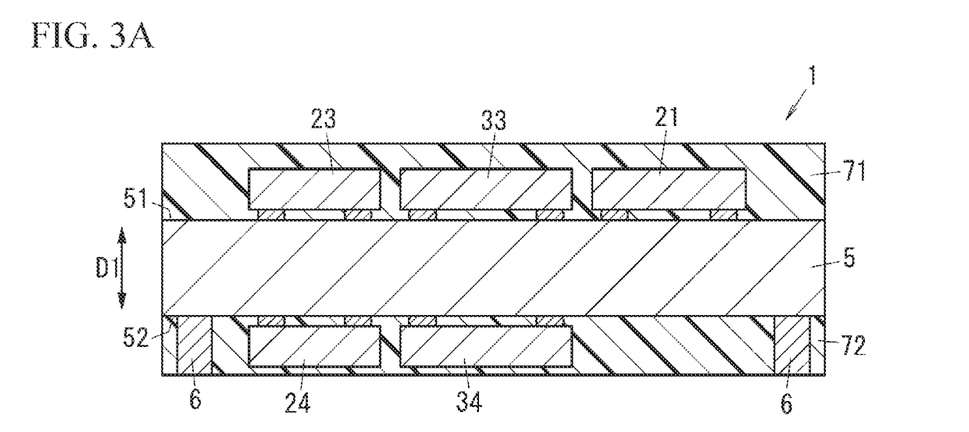
FIG. 3A is a sectional view of the radio-frequency module according to the embodiment taken along line X1-X1 in FIG. 1.
Figure 3B:
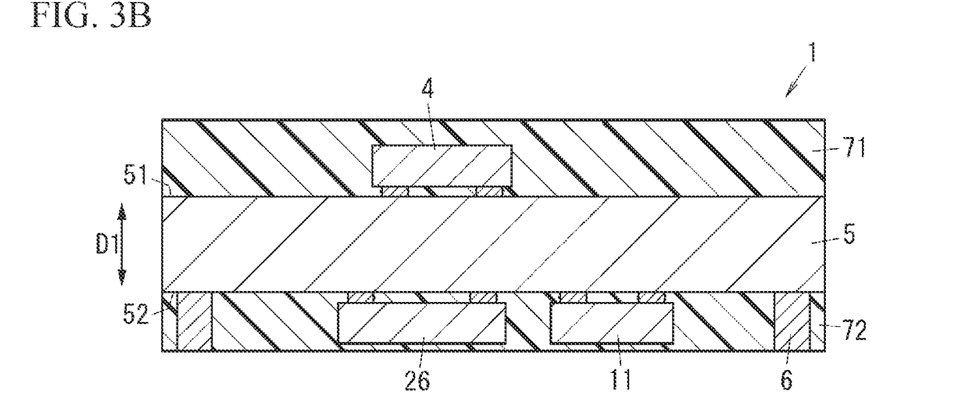
FIG. 3B is a sectional view of the radio-frequency module according to the embodiment taken along line X2-X2 in FIG. 1.

As illustrated in FIGS. 1, 3A, and 3B, the first transmission filter 23 is disposed on a side where the first main surface 51 of the mounting substrate 5 is located. In the example in FIGS. 1, 3A, and 3B, the first transmission filter 23 is mounted on the first main surface 51 of the mounting substrate 5. In other words, the first transmission filter 23 is disposed nearer to the first main surface 51 than to the second main surface 52 of the mounting substrate 5 and is at least partially mounted on the first main surface 51.

The first transmission filter 23 is, for example, an acoustic wave filter that includes a plurality of series arm resonators and a plurality of parallel arm resonators. The acoustic wave filter is, for example, a surface acoustic wave (SAW) filter that utilizes surface acoustic waves. In addition, the first transmission filter 23 may include at least one out of an inductor and a capacitor that is serially connected to any one of the plurality of series arm resonators and may include an inductor or a capacitor that is serially connected to any one of the plurality of parallel arm resonators.

Figure 2:
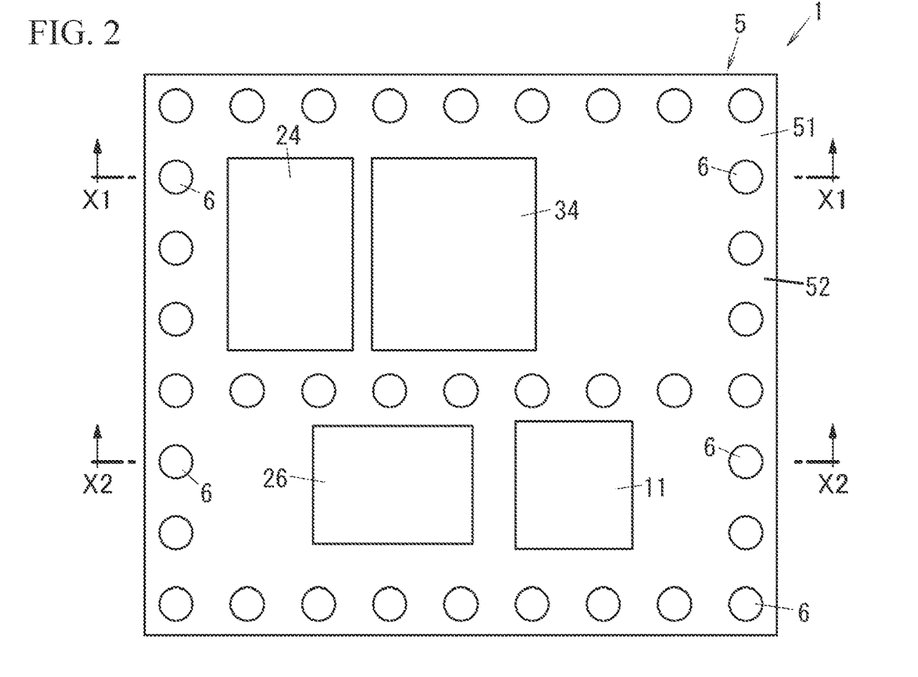
FIG. 2 is a transparent view of the radio-frequency module according to the embodiment.

As illustrated in FIGS. 2, 3A, and 3B, the first reception filter 24 is disposed on a side where the second main surface 52 of the mounting substrate 5 is located. In the example in FIGS. 2, 3A, and 3B, the first reception filter 24 is mounted on the second main surface 52 of the mounting substrate 5. In other words, the first reception filter 24 is disposed nearer to the second main surface 52 than to the first main surface 51 of the mounting substrate 5 and is at least partially mounted on the second main surface 52.

As with the first transmission filter 23, the first reception filter 24 is, for example, an acoustic wave filter that includes a plurality of series arm resonators and a plurality of parallel arm resonators. The acoustic wave filter is, for example, a SAW filter that utilizes surface acoustic waves. In addition, the first reception filter 24 may include at least one out of an inductor and a capacitor that is serially connected to any one of the plurality of series arm resonators and may include an inductor or a capacitor that is serially connected to any one of the plurality of parallel arm resonators.

The first transmission filter 23 and the first reception filter 24 are used in transmission and reception of TDD signals. It is often the case that a single filter that allows TDD signals to pass therethrough is used for both transmission and reception, but in this embodiment, a transmission filter that allows a transmission signal to pass therethrough (first transmission filter 23) and a reception filter that allows a reception signal to pass therethrough (first reception filter 24) are separately provided. The first transmission filter 23 is disposed on a side where the first main surface 51 of the mounting substrate 5 is located, and the first reception filter 24 is disposed on a side where the second main surface 52 of the mounting substrate 5 is located.

As illustrated in FIGS. 1, 2, 3A, and 3B, the first low-noise amplifier 26 is disposed on a side where the second main surface 52 of the mounting substrate 5 is located. In the example in FIGS. 1, 2, 3A, and 3B, the first low-noise amplifier 26 is mounted on the second main surface 52 of the mounting substrate 5. Part of the first low-noise amplifier 26 may be mounted on the second main surface 52 of the mounting substrate 5, and the remainder of the first low-noise amplifier 26 may be built into the mounting substrate 5. In short, the first low-noise amplifier 26 is disposed nearer to the second main surface 52 than to the first main surface 51 of the mounting substrate 5 and is at least partially mounted on the second main surface 52.

Although not illustrated in FIG. 1, the first output matching network 22 is disposed on a side where the first main surface 51 of the mounting substrate 5 is located. The first output matching network 22 is, for example, mounted on the first main surface 51 of the mounting substrate 5. The first output matching network 22 includes at least one out of an inductor and a capacitor. The inductor is, for example, a chip-like element that is mounted on the first main surface 51 of the mounting substrate 5 or a wiring pattern part that is built into the mounting substrate 5. The capacitor is, for example, a chip-like element that is mounted on the first main surface 51 of the mounting substrate 5 or a wiring pattern part that is built into the mounting substrate 5. In short, the first output matching network 22 is disposed nearer to the first main surface 51 than to the second main surface 52 of the mounting substrate 5 and is at least partially mounted on the first main surface 51.

Although not illustrated in FIG. 2, the first input matching network 25 (refer to FIG. 4) is disposed on a side where the second main surface 52 of the mounting substrate 5 is located. The first input matching network 25 is, for example, mounted on the second main surface 52 of the mounting substrate 5. The first input matching network 25 includes at least one out of an inductor and a capacitor. The inductor is, for example, a chip-like element that is mounted on the second main surface 52 of the mounting substrate 5 or a wiring pattern part that is built into the mounting substrate 5. The capacitor is, for example, a chip-like element that is mounted on the second main surface 52 of the mounting substrate 5 or a wiring pattern part that is built into the mounting substrate 5. In short, the first input matching network 25 is disposed nearer to the second main surface 52 than to the first main surface 51 of the mounting substrate 5 and is at least partially mounted on the second main surface 52.

(3.3) Circuit Elements for Second Communication Band

As illustrated in FIGS. 1, 3A, and 3B, the second transmission filter 33 is disposed on a side where the first main surface 51 of the mounting substrate 5 is located. In the example in FIGS. 1, 3A, and 3B, the second transmission filter 33 is mounted on the first main surface 51 of the mounting substrate 5. However, part of the second transmission filter 33 may be mounted on the first main surface 51 of the mounting substrate 5, and the remainder of the second transmission filter 33 may be built into the mounting substrate 5. In short, the second transmission filter 33 is provided separately from the second reception filter 34, and is disposed nearer to the first main surface 51 than to the second main surface 52 of the mounting substrate 5 and is at least partially mounted on the first main surface 51.

Part of the second transmission filter 33 overlaps the second reception filter 34 in plan view in the thickness direction D1 of the mounting substrate 5. However, the entirety of the second transmission filter 33 may overlap the second reception filter 34 in plan view in the thickness direction D1 of the mounting substrate 5. In short, it is preferable that at least part of the second transmission filter 33 overlap the second reception filter 34 in plan view in the thickness direction D1 of the mounting substrate 5.

As illustrated in FIGS. 2, 3A, and 3B, the second reception filter 34 is disposed on a side where the second main surface 52 of the mounting substrate 5 is located. In the example in FIGS. 2, 3A, and 3B, the second reception filter 34 is mounted on the second main surface 52 of the mounting substrate 5. However, part of the second reception filter 34 may be mounted on the second main surface 52 of the mounting substrate 5, and the remainder of the second reception filter 34 may be built into the mounting substrate 5. In short, the second reception filter 34 is disposed nearer to the second main surface 52 than to the first main surface 51 of the mounting substrate 5 and is at least partially mounted on the second main surface 52.

Part of the second reception filter 34 overlaps the second transmission filter 33 in plan view in the thickness direction D1 of the mounting substrate 5. However, the entirety of the second reception filter 34 may overlap the second transmission filter 33 in plan view in the thickness direction D1 of the mounting substrate 5. In short, it is preferable that at least part of the second reception filter 34 overlap the second transmission filter 33 in plan view in the thickness direction D1 of the mounting substrate 5.

Although not illustrated in FIG. 1, the second power amplifier 31 (refer to FIG. 4) is disposed on a side where the first main surface 51 of the mounting substrate 5 is located. The second power amplifier 31 is, for example, mounted on the first main surface 51 of the mounting substrate 5. However, part of the second power amplifier 31 may be mounted on the first main surface 51 of the mounting substrate 5, and the remainder of the second power amplifier 31 may be built into the mounting substrate 5. In short, the second power amplifier 31 is disposed nearer to the first main surface 51 than to the second main surface 52 of the mounting substrate 5 and is at least partially mounted on the first main surface 51.

Although not illustrated in FIG. 1, the second output matching network 32 (refer to FIG. 4) is disposed on a side where the first main surface 51 of the mounting substrate 5 is located. The second output matching network 32 is, for example, mounted on the first main surface 51 of the mounting substrate 5. The second output matching network 32 includes at least one out of an inductor and a capacitor. The inductor is, for example, a chip-like element that is mounted on the first main surface 51 of the mounting substrate 5 or a wiring pattern part that is built into the mounting substrate 5. The capacitor is, for example, a chip-like element that is mounted on the first main surface 51 of the mounting substrate 5 or a wiring pattern part that is built into the mounting substrate 5. In short, the second output matching network 32 is disposed nearer to the first main surface 51 than to the second main surface 52 of the mounting substrate 5 and is at least partially mounted on the first main surface 51.

Although not illustrated in FIG. 2, the second input matching network 35 (refer to FIG. 4) is disposed on a side where the second main surface 52 of the mounting substrate 5 is located. The second input matching network 35 is, for example, mounted on the second main surface 52 of the mounting substrate 5. The second input matching network 35 includes at least one out of an inductor and a capacitor. The inductor is, for example, a chip-like element that is mounted on the second main surface 52 of the mounting substrate 5 or a wiring pattern part that is built into the mounting substrate 5. The capacitor is, for example, a chip-like element that is mounted on the second main surface 52 of the mounting substrate 5 or a wiring pattern part that is built into the mounting substrate 5. In short, the second input matching network 35 is disposed nearer to the second main surface 52 than to the first main surface 51 of the mounting substrate 5 and is at least partially mounted on the second main surface 52.

Although not illustrated in FIG. 2, the second low-noise amplifier 36 (refer to FIG. 4) is disposed on a side where the first main surface 51 of the mounting substrate 5 is located. The second power amplifier 31 is, for example, mounted on the second main surface 52 of the mounting substrate 5. However, part of the second power amplifier 31 may be mounted on the first main surface 51 of the mounting substrate 5, and the remainder of the second power amplifier 31 may be built into the mounting substrate 5. In short, the second power amplifier 31 is disposed nearer to the first main surface 51 than to the second main surface 52 of the mounting substrate 5 and is at least partially mounted on the first main surface 51.

(3.4) Antenna Switch

As illustrated in FIGS. 1, 3A, and 3B, the antenna switch 4 is disposed on a side where the first main surface 51 of the mounting substrate 5 is located. The antenna switch 4 is, for example, mounted on the first main surface 51 of the mounting substrate 5. Alternatively, part of the antenna switch 4 may be mounted on the first main surface 51 of the mounting substrate 5, and the remainder of the antenna switch 4 may be built into the mounting substrate 5. In short, the antenna switch 4 is disposed nearer to the first main surface 51 than to the second main surface 52 of the mounting substrate 5 and is at least partially mounted on the first main surface 51.

The antenna switch 4 may be disposed on a side where the second main surface 52 of the mounting substrate 5 is located. The antenna switch 4 may be, for example, mounted on the second main surface 52 of the mounting substrate 5. Alternatively, part of the antenna switch 4 may be mounted on the second main surface 52 of the mounting substrate 5, and the remainder of the antenna switch 4 may be built into the mounting substrate 5. In short, the antenna switch 4 is disposed nearer to the second main surface 52 than to the first main surface 51 of the mounting substrate 5 and is at least partially mounted on the second main surface 52.

(3.5) External Connection Terminals

As illustrated in FIGS. 2, 3A, and 3B, the plurality of external connection terminals 6 are terminals for electrically connecting the mounting substrate 5 and an external substrate (not illustrated) to each other. The plurality of external connection terminals 6 includes the first common terminal 61, the first input terminal 62, the first output terminal 63, the second common terminal 64, the second input terminal 65, and the second output terminal 66 illustrated in FIG. 4, and a plurality of ground electrodes.

The plurality of external connection terminals 6 are disposed on a side where the second main surface 52 of the mounting substrate 5 is located. The plurality of external connection electrodes 6 are columnar (for example, cylindrical) electrodes provided on the second main surface 52 of the mounting substrate 5. The material of the plurality of external connection terminals 6 is, for example, a metal (for example, copper, a copper alloy, and so forth). Each of the plurality of external connection terminals 6 has, in the thickness direction D1 of the mounting substrate 5, a base end portion that is bonded to the second main surface 52 of the mounting substrate 5 and a tip end portion that is on the opposite side from the base end portion. The tip end portion of each of the plurality of external connection terminals 6 may include a metal plating layer, for example.

In the radio-frequency module 1, the plurality of external connection terminals 6 are provided from the viewpoint of improving ease of mounting of the radio-frequency module 1 on a mother substrate and increasing the number of ground electrodes of the radio-frequency module 1.

(3.6) First Resin Member and Second Resin Member

As illustrated in FIGS. 3A and 3B, the first resin member 71 is provided on the first main surface 51 of the mounting substrate 5 and covers circuit elements disposed on the first main surface 51 and the first main surface 51 of the mounting substrate 5. The first resin member 71 has a function of ensuring reliability in terms of the mechanical strength, moisture resistance, and so forth of the circuit elements disposed on the first main surface 51.

As illustrated in FIGS. 3A and 3B, the second resin member 72 is provided on the second main surface 52 of the mounting substrate 5 and covers circuit elements disposed on the second main surface 52 and the second main surface 52 of the mounting substrate 5. The second resin member 72 has a function of ensuring reliability in terms of the mechanical strength, moisture resistance, and so forth of the circuit elements disposed on the second main surface 52.

(3.7) Arrangement Relationships

As described above, the first power amplifier 21, the first transmission filter 23, the second power amplifier 31, the second transmission filter 33, and the antenna switch 4 are disposed nearer to the first main surface 51 than to the second main surface 52 of the mounting substrate 5 and are at least partially mounted on the first main surface 51. In other words, the first power amplifier 21, the first transmission filter 23, the second power amplifier 31, the second transmission filter 33, and the antenna switch 4 are disposed on a side where the first main surface 51 of the mounting substrate 5 is located. On the other hand, the first reception filter 24, the first low-noise amplifier 26, the second reception filter 34, the second low-noise amplifier 36, and the power amplifier controller 11 are disposed nearer to the second main surface 52 than to the first main surface 51 of the mounting substrate 5 and are at least partially mounted on the second main surface 52. In other words, the first reception filter 24, the first low-noise amplifier 26, the second reception filter 34, the second low-noise amplifier 36, and the power amplifier controller 11 are disposed on a side where the second main surface 52 of the mounting substrate 5 is located.

Thus, the leakage of the first transmission signal from the first power amplifier 21 and the first transmission filter 23 to the first reception filter 24 and the first low-noise amplifier 26 can be reduced. Similarly, the leakage of the second transmission signal from the second power amplifier 31 and the second transmission filter 33 to the second reception filter 34 and the second low-noise amplifier 36 can be reduced.

(4) Detailed Structure of Each Constituent Element of Radio-Frequency Module (4.1) Mounting Substrate The mounting substrate 5 illustrated in FIGS. 1, 2, 3A, and 3B is, for example, a printed wiring board, a low temperature co-fired ceramic substrate, or the like. In this case, the mounting substrate 5 is, for example, a multilayer substrate that includes a plurality of dielectric layers and a plurality of conductor pattern layers. The plurality of dielectric layers and the plurality of conductor pattern layers are stacked in the thickness direction D1 of the mounting substrate 5. The plurality of conductor pattern layers are formed in prescribed patterns. The plurality of conductor pattern layers each include one or a plurality of conductor parts within a plane that is perpendicular to the thickness direction D1 of the mounting substrate 5. The material of the conductor pattern layers is, for example, copper.

The first main surface 51 and the second main surface 52 of the mounting substrate 5 are separated from each other in the thickness direction D1 of the mounting substrate 5 and intersect the thickness direction D1 of the mounting substrate 5. The first main surface 51 of the mounting substrate 5 is, for example, perpendicular to the thickness direction D1 of the mounting substrate 5, but may, for example, include the side surfaces of conductor parts as surfaces that are not perpendicular to the thickness direction D1. In addition, the second main surface 52 of the mounting substrate 5 is, for example, perpendicular to the thickness direction D1 of the mounting substrate 5, but may, for example, include the side surfaces of conductive parts as surfaces that are not perpendicular to the thickness direction D1. In addition, minute irregularities, recesses, or protrusions may be formed on the first main surface 51 and the second main surface 52 of the mounting substrate 5.

(4.2) Filters

The detailed structures of the first transmission filter 23, the first reception filter 24, the second transmission filter 33, and the second reception filter 34 illustrated in FIG. 4 will be described. In the following description, the first transmission filter 23, the first reception filter 24, the second transmission filter 33, and the second reception filter 34 are referred to as filters without distinguishing between them.

Each filter is a one chip filter. In this case, in the filter, for example, a plurality of series arm resonators and a plurality of parallel arm resonators each consist of acoustic wave resonators. In this case, for example, the filter includes a substrate, a piezoelectric layer, and a plurality of interdigital transducer (IDT) electrodes. The substrate has a first surface and a second surface. The piezoelectric layer is provided on the first surface of the substrate. The piezoelectric layer is provided on a low-acoustic-velocity film. The plurality of IDT electrodes are provided on the piezoelectric layer. In this case, the low-acoustic-velocity film is directly or indirectly provided on the substrate. In addition, the piezoelectric layer is directly or indirectly provided on the low-acoustic-velocity film. In the low-acoustic-velocity film, the acoustic velocity of a propagating bulk wave is lower than the acoustic velocity of an acoustic wave propagating through the piezoelectric layer. In the substrate, the acoustic velocity of a propagating bulk wave is higher than the acoustic velocity of an acoustic wave propagating through the piezoelectric layer. The material of the piezoelectric layer is, for example, composed of lithium tantalate. The material of the low-acoustic-velocity film is, for example, silicon oxide. The substrate is a silicon substrate, for example. The thickness of the piezoelectric layer is less than or equal to $3.5\lambda$, where $\lambda$ is the wavelength of an acoustic wave determined by the electrode finger period of the IDT electrodes. The thickness of the low-acoustic-velocity film is less than or equal to $2.0\lambda$, for example.

The piezoelectric layer is preferably formed of, for example, lithium tantalate, lithium niobate, zinc oxide, aluminum nitride, or lead zirconate titanate. In addition, the low-acoustic-velocity film preferably contains at least one material selected from a group consisting of silicon oxide, glass, silicon oxynitride, tantalum oxide, and a compound obtained by adding fluorine, carbon, or boron to silicon oxide. In addition, the substrate may also contain at least one material selected from a group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The filter, for example, further includes a spacer layer and a cover member. The spacer layer and the cover member are provided on the first surface of the substrate. The spacer layer surrounds the plurality of IDT electrodes in plan view in the thickness direction of the substrate. The spacer layer is frame shaped (rectangular frame shaped) in plan view in the thickness direction of the substrate. The spacer layer has an electrically insulating property. The material of the spacer layer is, for example, a composite resin such as an epoxy resin or polyimide. The cover member has a flat plate like shape. The cover member has a rectangular shape in plan view in the thickness direction of the substrate, but not limited to this shape, and may instead have a square shape, for example. In the filter, the cover member and the spacer layer have substantially the same outer size when viewed in plan view in the thickness direction of the substrate. The cover member is disposed on the spacer layer so as to face the substrate in the thickness direction of the substrate. The cover member overlaps the plurality of IDT electrodes in the thickness direction of the substrate and is separated from the plurality of IDT electrodes in the thickness direction of the substrate. The cover member has an electrically insulating property. The material of the cover member is, for example, a composite resin such as an epoxy resin or polyimide. The filter has a space that is surrounded by the substrate, the spacer layer, and the cover member. The space in the filter is filled with a gas. The gas is, for example, air, an inert gas (for example, nitrogen gas), or the like. A plurality of terminals are exposed from the cover member. Each of the plurality of terminals is, for example, a bump. The bumps are solder bumps, for example. The bumps are not limited to being solder bumps and may instead be metal bumps, for example.

The filter may include an adhesive layer interposed between the low-acoustic-velocity film and the piezoelectric layer, for example. The adhesive layer is, for example, composed of a resin (epoxy resin or polyimide resin). In addition, the filter may include a dielectric film between the low-acoustic-velocity film and the piezoelectric layer, on the piezoelectric layer, or under the low-acoustic-velocity film.

Furthermore, the filter may include a high-acoustic-velocity film interposed between the substrate and the low-acoustic-velocity film, for example. In this case, the high-acoustic-velocity film is directly or indirectly provided on the substrate. The low-acoustic-velocity film is directly or indirectly provided on the high-acoustic-velocity film. The piezoelectric layer is directly or indirectly provided on the low-acoustic-velocity film. In the high-acoustic-velocity film, the acoustic velocity of a propagating bulk wave is higher than the acoustic velocity of an acoustic wave propagating through the piezoelectric layer. In the low-acoustic-velocity film, the acoustic velocity of a propagating bulk wave is lower than the acoustic velocity of an acoustic wave propagating through the piezoelectric layer.

The high-acoustic-velocity film is composed of a piezoelectric material such as diamond-like carbon, aluminum nitride, aluminum oxide, silicon carbide, silicon nitride, silicon, sapphire, lithium tantalate, lithium niobate or quartz, any of various ceramics such as alumina, zirconia, cordierite, mullite, steatite or forsterite, magnesia, diamond, a material having any of these materials as a main component, or a material having a mixture of any of these materials as a main component.

Regarding the thickness of the high-acoustic-velocity film, since the high-acoustic-velocity film has a function of confining the acoustic waves to the piezoelectric layer and the low-acoustic-velocity film, it is desirable that the high-acoustic-velocity film be thicker. The piezoelectric substrate may include other films such as an adhesive layer, a dielectric film and so on in addition to high-acoustic-velocity film, the low-acoustic-velocity film, and the piezoelectric layer.

The plurality of series arm resonators and the plurality of parallel arm resonators are not limited to being acoustic wave resonators as described above, and may instead be SAW resonators or bulk acoustic wave (BAW) resonators, for example. In this case, for example, a SAW resonator includes a piezoelectric substrate and IDT electrodes provided on the piezoelectric substrate. In the case where a plurality of series arm resonators and a plurality of parallel arm resonators of the filter are formed of SAW resonators, the filter includes a plurality of IDT electrodes having a one-to-one correspondence with the plurality of series arm resonators and a plurality of IDT electrodes having a one-to-one correspondence with the plurality of parallel arm resonators on a single piezoelectric substrate. The piezoelectric substrate is, for example, a lithium tantalate substrate, a lithium niobate substrate, or the like.

(4.3) Antenna Switch

The antenna switch 4 illustrated in FIG. 1 is a switch IC. In more detail, the antenna switch 4 is, for example, a one chip IC that includes a substrate and a switch function part. The substrate has a first surface and a second surface, which face each other. The substrate is a silicon substrate, for example. The switch function part includes a field effect transistor (FET) formed on the first surface of the substrate. The switch function part is a functional part having a function of switching a connection state. The antenna switch 4 is flip chip mounted on the second main surface 52 of the mounting substrate 5 so that the first surface of the substrate is located on the side near the second main surface 52 of the mounting substrate 5. The antenna switch 4 has a quadrangular outer peripheral shape in plan view in the thickness direction D1 of the mounting substrate 5.

(4.4) Power Amplifiers

Next, the structures of the first power amplifier 21 and the second power amplifier 31 illustrated in FIG. 4 will be described in detail. In the following description, the first power amplifier 21 and the second power amplifier 31 are each referred to as a power amplifier without distinguishing between them.

Each power amplifier is, for example, a one chip IC that includes a substrate and an amplifying function part. The substrate has a first surface and a second surface, which face each other. The substrate is, for example, a gallium arsenide substrate. The amplifying function part includes at least one transistor formed on the first surface of the substrate. The amplifying function part is a functional part that has a function of amplifying a transmission signal of a prescribed frequency band. The transistor is, for example, a heterojunction bipolar transistor (HBT). In the power amplifier, a power supply voltage from a power amplifier controller is applied between the collector and the emitter of the HBT. The power amplifier may, for example, include a DC cut capacitor in addition to the amplifying function part. The power amplifier is, for example, flip chip mounted on the first main surface 51 of the mounting substrate 5 so that the first surface of the substrate is located on the side near the first main surface 51 of the mounting substrate 5. The power amplifier has a quadrangular outer peripheral shape in plan view in the thickness direction D1 of the mounting substrate 5.

(4.5) Low-Noise Amplifiers

Next, the structures of the first low-noise amplifier 26 and the second low-noise amplifier 36 illustrated in FIG. 4 will be described in detail. In the following description, the first low-noise amplifier 26 and the second low-noise amplifier 36 are each referred to as a low-noise amplifier without distinguishing between them.

Each low-noise amplifier is, for example, a single IC chip that includes a substrate and an amplifying function part. The substrate has a first surface and a second surface, which face each other. The substrate is a silicon substrate, for example. The amplifying function part is formed on the first surface of the substrate. The amplifying function part is a functional part that has a function of amplifying a reception signal of a prescribed frequency band. The low-noise amplifier is, for example, flip chip mounted on the second main surface 52 of the mounting substrate 5 so that the first surface of the substrate is located on the side near the second main surface 52 of the mounting substrate 5. The low-noise amplifier has a quadrangular outer peripheral shape in plan view in the thickness direction D1 of the mounting substrate 5.

(4.6) Output Matching Networks

Next, the structures of the first output matching network 22 and the second output matching network 32 illustrated in FIG. 4 will be described in detail. In the following description, the first output matching network 22 and the second output matching network 32 are each referred to as an output matching network without distinguishing between them.

Each of a plurality of inductors in the output matching networks is, for example, a chip inductor. The plurality of inductors in the output matching networks are, for example, mounted on the first main surface 51 of the mounting substrate 5, but are not limited to this arrangement. In addition, each of the plurality of capacitors of the output matching networks is a chip capacitor, for example. The plurality of capacitors in the output matching networks are, for example, mounted on the first main surface 51 of the mounting substrate 5, but are not limited to this arrangement. Each output matching network may be, for example, a one chip integrated passive device (IPD) that includes a substrate, a plurality of inductors, and a plurality of capacitors. The substrate has a first surface and a second surface, which face each other. The substrate is a silicon substrate, for example. The plurality of inductors and the plurality of capacitors are formed on the first surface of the substrate. In the case of an IPD, each output matching network is, for example, flip chip mounted on the first main surface 51 of the mounting substrate 5 so that the first surface of the substrate is located on the side near the first main surface 51 of the mounting substrate 5.

(4.7) Input Matching Networks

Next, the structures of the first input matching network 25 and the second input matching network 35 illustrated in FIG. 4 will be described in detail. In the following description, the first input matching network 25 and the second input matching network 35 are each referred to as an input matching network without distinguishing between them.

The inductors in the input matching networks are chip inductors, for example. The inductors in the input matching networks are, for example, mounted on the first main surface 51 of the mounting substrate 5, but are not limited to being mounted on the first main surface 51 of the mounting substrate 5.

(5) Communication Device

As illustrated in FIG. 4, the communication device 8 includes the radio-frequency module 1, a plurality of (two in the illustrated example) antennas 81, and the signal processing circuit 82. The plurality of antennas 81 includes the first antenna 811 and the second antenna 812.

The first antenna 811 is connected to the first common terminal 61 of the radio-frequency module 1. The first antenna 811 has a transmission function of radiating the first transmission signal outputted from the radio-frequency module 1 in the form of radio waves and a reception function of receiving the first reception signal in the form of radio waves from the outside and outputting the received first reception signal to the radio-frequency module 1.

The second antenna 812 is connected to the second common terminal 64 of the radio-frequency module 1. The second antenna 812 has a transmission function of radiating the second transmission signal outputted from the radio-frequency module 1 in the form of radio waves and a reception function of receiving the second reception signal in the form of radio waves from the outside and outputting the received second reception signal to the radio-frequency module 1.

The signal processing circuit 82 includes, for example, the RF signal processing circuit 83 and a baseband signal processing circuit 84. The signal processing circuit 82 processes the first transmission signal and the first reception signal and the second transmission signal and the second reception signal.

The RF signal processing circuit 83 is, for example, a radio-frequency integrated circuit (RFIC) and performs signal processing on radio-frequency signals.

The RF signal processing circuit 83, for example, performs signal processing such as up conversion on a radio-frequency signal outputted from the baseband signal processing circuit 84 and outputs the radio-frequency signal resulting from this signal processing to the radio-frequency module 1. Specifically, the RF signal processing circuit 83 performs signal processing such as up conversion on the first transmission signal outputted from the baseband signal processing circuit 84 and outputs the first transmission signal on which the signal processing has been performed to the first transmission path T11 of the radio-frequency module 1. In addition, the RF signal processing circuit 83 performs signal processing such as up conversion on the second transmission signal outputted from the baseband signal processing circuit 84 and outputs the second transmission signal on which the signal processing has been performed to the second transmission path T21 of the radio-frequency module 1.

The RF signal processing circuit 83, for example, performs signal processing such as down conversion on a radio-frequency signal outputted from the radio-frequency module 1 and outputs the radio-frequency signal resulting from this signal processing to the baseband signal processing circuit 84. Specifically, the RF signal processing circuit 83 performs signal processing on the first reception signal outputted from the first reception path T12 of the radio-frequency module 1 and outputs the first reception signal on which the signal processing has been performed to the baseband signal processing circuit 84. In addition, the RF signal processing circuit 83 performs signal processing on the second reception signal outputted from the second reception path T22 of the radio-frequency module 1 and outputs the second reception signal on which the signal processing has been performed to the baseband signal processing circuit 84.

The baseband signal processing circuit 84 is, for example, a baseband integrated circuit (BBIC) and performs prescribed signal processing on a transmission signal from outside the signal processing circuit 82. A reception signal processed by the baseband signal processing circuit 84 is, for example, used as an image signal for image display or is used as an audio signal for a telephone call.

In addition, the RF signal processing circuit 83 also functions as a control unit that controls the connections of the antenna switch 4 of the radio-frequency module 1 on the basis of the communication band (frequency band) that is used. Specifically, the RF signal processing circuit 83 switches the connections of the antenna switch 4 of the radio-frequency module 1 on the basis of a control signal (not illustrated). The control unit may be provided outside the RF signal processing circuit 83, and, for example, may be provided in the radio-frequency module 1 or the baseband signal processing circuit 84.

(6) Effects

In the radio-frequency module 1 according to the embodiment, the first transmission filter 23 for the TDD transmission signal is disposed on a side where the first main surface 51 of the mounting substrate 5 is located. In addition, the first reception filter 24 for the TDD reception signal is disposed on a side where the second main surface 52 of the mounting substrate 5 is located. Since the first transmission filter 23 and the first reception filter 24 are disposed on the opposite sides from each other with the mounting substrate 5 interposed therebetween, leaking of the TDD transmission signal to the first reception filter 24 can be made less likely to occur. As a result, the isolation between the transmission of the TDD transmission signal and the reception of the TDD reception signal can be improved. This enables the reception sensitivity to the TDD reception signal to be improved.

(7) Modifications

Hereafter, modifications of the embodiment will be described.

Figure 5A:
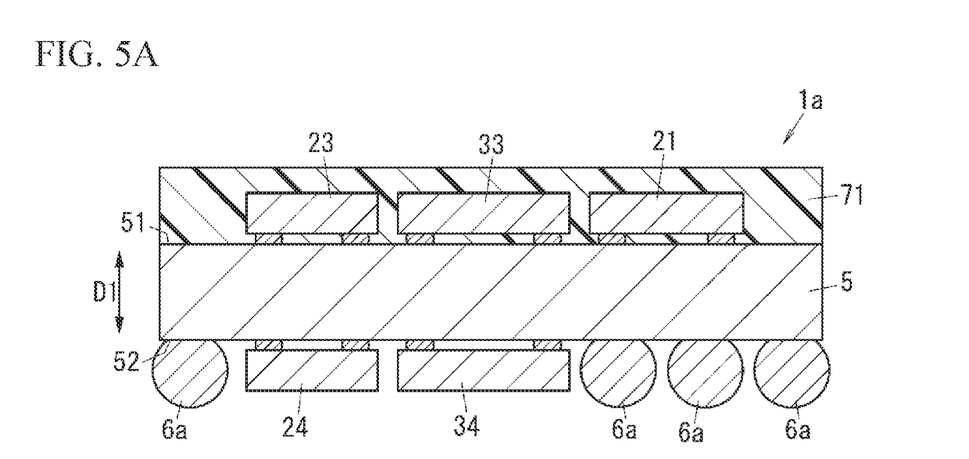
FIGS. 5A and 5B are sectional views of a radio-frequency module according to a modification of the embodiment.
Figure 5B:
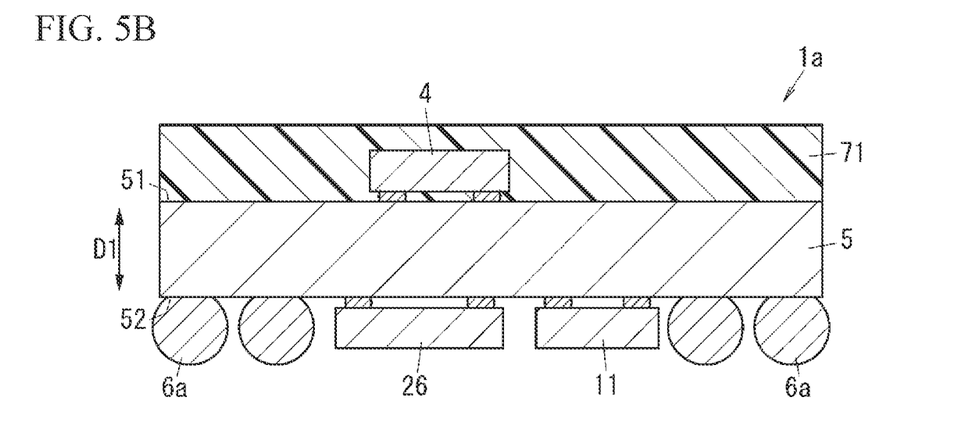

As a modification of the embodiment, a radio-frequency module 1a may include a plurality of external connection terminals 6a as illustrated in FIGS. 5A and 5B in addition to the plurality of external connection terminals 6 (refer to FIGS. 3A and 3B).

The plurality of external connection terminals 6a are not columnar electrodes and have a bump structure. The plurality of external connection terminals 6a are disposed on a side where the second main surface 52 of the mounting substrate 5 is located. In the radio-frequency module 1a according to this modification, the second resin member 72 is omitted.

As another modification of the embodiment, the second transmission signal and the second reception signal may be TDD signals rather than FDD signals. In this modification as well, the second power amplifier 31 and the second transmission filter 33 are disposed on a side where the first main surface 51 of the mounting substrate 5 is located, and the second reception filter 34 and the second low-noise amplifier 36 are disposed on a side where the second main surface 52 of the mounting substrate 5 is located.

In the radio-frequency module 1 according to this modification, since the second transmission filter 33 and the second reception filter 34 are disposed on the opposite sides from each other with the mounting substrate 5 interposed therebetween, leaking of the TDD transmission signal to the second reception filter 34 can be made less likely to occur. As a result, the isolation between the transmission of the TDD transmission signal and the reception of the TDD reception signal can be improved. This enables the reception sensitivity to the TDD reception signal to be improved.

In the embodiment, the first transmission filter 23 and the second transmission filter 33 are, for example, surface acoustic wave filters. However, as another modification of the embodiment, the first transmission filter 23 and the second transmission filter 33 are not limited to being surface acoustic wave filters and may be a type of filter other than a surface acoustic wave filter. The first transmission filter 23 and the second transmission filter 33 may be, for example, an acoustic wave filter that uses bulk acoustic waves (BAWs), an LC resonance filter, or a dielectric filter.

The radio-frequency modules according to these modifications also exhibit the same effects as the radio-frequency module 1 according to the embodiment.

In addition, in the present disclosure, "an arbitrary constituent element is disposed on a side where a first main surface of a mounting substrate is located" means that, for a mounting substrate having a first main surface and a second main surface that face each other, the constituent element is disposed nearer to the first main surface than to the second main surface of the mounting substrate. Examples of "an arbitrary constituent element is disposed on a side where a first main surface of a mounting substrate is located" include a case where the constituent element is disposed on the first main surface of the mounting substrate and a case where the constituent element is disposed so as to be separated from the first main surface of the mounting substrate. Examples of "an arbitrary constituent element is disposed on a first main surface of a mounting substrate" include a case where the constituent element is mounted on the first main surface of the mounting substrate and a case where part of the constituent element is mounted on the first main surface of the mounting substrate and the remainder of the constituent element is built into the mounting substrate. Examples of "an arbitrary constituent element is disposed so as to be separated from a first main surface of a mounting substrate" include a case where the constituent element and another constituent element are stacked. In this case, the other constituent element is mounted on the first main surface of the mounting substrate and the first constituent element is stacked on the other constituent element. Yet another constituent element may be interposed between the constituent element and the other constituent element.

Similarly, in the present disclosure, "an arbitrary constituent element is disposed on a side where a second main surface of a mounting substrate is located" means that, for a mounting substrate having a first main surface and a second main surface that face each other, the constituent element is disposed nearer to the second main surface than to the first main surface of the mounting substrate. Examples of "an arbitrary constituent element is disposed on a side where a second main surface of a mounting substrate is located" include a case where the constituent element is disposed on the second main surface of the mounting substrate and a case where the constituent element is disposed so as to be separated from the second main surface of the mounting substrate. Examples of "an arbitrary constituent element is disposed on a second main surface of a mounting substrate" include a case where the constituent element is mounted on the second main surface of the mounting substrate and a case in which part of the constituent element is mounted on the second main surface of the mounting substrate and the remainder of the constituent element is built into the mounting substrate. Examples of "a constituent element is disposed so as to be separated from a second main surface of a mounting substrate" include a case where the constituent element and another constituent element are stacked. In this case, the other constituent element is mounted on the second main surface of the mounting substrate and the first constituent element is stacked on the other constituent element. Yet another constituent element may be interposed between the constituent element and the other constituent element.

The above-described embodiments and modifications are merely some examples of various embodiments and modifications of the present disclosure. In addition, so long as the object of the present disclosure can be achieved, the embodiments and modifications can be changed in various ways in accordance with the design and so forth.

(Aspects)

The following aspects are disclosed in the present specification.

A radio-frequency module (1; 1a) according to a First Aspect includes a mounting substrate (5), a power amplifier (first power amplifier 21), a low-noise amplifier (first low-noise amplifier 26), at least one first transmission filter (23), and at least one first reception filter (24). The mounting substrate (5) has a first main surface (51) and a second main surface (52). The first main surface (51) and the second main surface (52) face each other. The power amplifier is disposed on a side where the first main surface (51) of the mounting substrate (5) is located. The low-noise amplifier is disposed on a side where the second main surface (52) of the mounting substrate (5) is located. The first transmission filter (23) allows a TDD transmission signal to pass therethrough. The first reception filter (24) allows a TDD reception signal to pass therethrough. The first transmission filter (23) is disposed on the side where the first main surface (51) of the mounting substrate (5) is located. The first reception filter (24) is disposed on the side where the second main surface (52) of the mounting substrate (5) is located.

In the radio-frequency module (1; 1a) according to the First Aspect, since the first transmission filter (23) and the first reception filter (24) are disposed on the opposite sides from each other with the mounting substrate (5) interposed therebetween, leaking of the TDD transmission signal to the second reception filter (34) can be made less likely to occur. As a result, the isolation between the transmission of the TDD transmission signal and the reception of the TDD reception signal can be improved. This enables the reception sensitivity to the TDD reception signal to be improved.

A radio-frequency module (1; 1a) according to a Second Aspect based on the First Aspect further includes a plurality of external connection terminals (6; 6a). The plurality of external connection terminals (6; 6a) are disposed on the second main surface (52) of the mounting substrate (5).

A radio-frequency module (1; 1a) according to a Third Aspect based on the First or Second Aspect further includes a second transmission filter (33) and a second reception filter (34). The second transmission filter (33) allows a FDD transmission signal to pass therethrough. The second reception filter (34) allows an FDD reception signal to pass therethrough. The second transmission filter (33) is disposed on a side where the first main surface (51) of the mounting substrate (5) is located. The second reception filter (34) is disposed on a side where the second main surface (52) of the mounting substrate (5) is located.

In a radio-frequency module (1; 1a) according to a Fourth Aspect based on the Third Aspect, TDD communication and FDD communication are simultaneously performed.

In the radio-frequency module (1; 1a) according to the Fourth Aspect, TDD communication and FDD communication are simultaneously performed. In this simultaneous communication, leaking of the TDD transmission signal to the second reception filter (34) can be made less likely to occur even in a situation where there is likely to be an effect from the TDD transmission signal. As a result, the isolation between the transmission of the TDD transmission signal and the reception of the FDD reception signal can be improved even in the case of simultaneous communication.

A communication device (8) according to a Fifth Aspect includes the radio-frequency module (1; 1a) according to any one of the First to Fourth Aspects and a signal processing circuit (RF signal processing circuit 83, baseband signal processing circuit 84). The signal processing circuit processes a TDD transmission signal and a TDD reception signal.

1, 1a radio-frequency module
11 power amplifier controller
21 first power amplifier
22 first output matching network
23 first transmission filter
24 first reception filter
25 first input matching network
26 first low-noise amplifier
31 second power amplifier
32 second output matching network
33 second transmission filter
34 second reception filter
35 second input matching network
36 second low-noise amplifier
4 antenna switch
41 first common terminal
42, 421, 422 first selection terminal
43 second common terminal
44, 441, 442 second selection terminal
5 mounting substrate
51 first main surface
52 second main surface
6, 6a external connection terminal
61 first common terminal
62 first input terminal
63 first output terminal
64 second common terminal 65 second input terminal
66 second output terminal
71 first resin member
72 second resin member
8 communication device
81 antenna
811 first antenna
812 second antenna
82 signal processing circuit
83 RF signal processing circuit
84 baseband signal processing circuit
T11 first transmission path
T12 first reception path
T21 second transmission path
T22 second reception path
D1 thickness direction

The invention claimed is:

1. A radio-frequency module comprising:
a mounting substrate having a first main surface and a second main surface, the first and second main surfaces facing each other;
a power amplifier that is on a first main surface side of the mounting substrate;
a low-noise amplifier that is on a second main surface side of the mounting substrate;
a first transmission filter configured to pass a time division duplex (TDD) transmission signal;
a first reception filter configured to pass a TDD reception signal;
a second transmission filter configured to pass a frequency division duplex (FDD) transmission signal;
a second reception filter configured to pass an FDD reception signal; and
a plurality of external connection terminals,
wherein the first transmission filter is on the first main surface side of the mounting substrate, and
the first reception filter is on the second main surface side of the mounting substrate,
wherein the second transmission filter is on the first main surface side of the mounting substrate,
wherein the second reception filter is on the second main surface side of the mounting substrate,
wherein, as seen in a plan view of the radio-frequency module, the second transmission filter is between the first transmission filter and the power amplifier in a first direction,
wherein, as seen in the plan view of the radio-frequency module, the first reception filter is adjacent to the second reception filter in the first direction, and
wherein, as seen in the plan view of the radio-frequency module, the plurality of external connection terminals are adjacent to each other along the first direction and are between the low-noise amplifier and the first and second reception filters in a second direction, the second direction being orthogonal to the first direction.

2. The radio-frequency module according to claim 1, wherein the plurality of external connection terminals are on the second main surface side of the mounting substrate.

3. The radio-frequency module according to claim 1, wherein TDD communication and FDD communication are performed simultaneously.

4. The radio-frequency module according to claim 2, wherein, as seen in a plan view of the radio-frequency module, the plurality of external connection terminals are along a perimeter of the mounting substrate.

5. A communication device comprising:
the radio-frequency module according to claim 1; and
a signal processing circuit configured to process the TDD transmission signal and the TDD reception signal.

* * * * *